US012313975B2

(12) United States Patent
Aviel et al.

(10) Patent No.: US 12,313,975 B2
(45) Date of Patent: May 27, 2025

(54) REDUCED FLOW RATE PROCESSING SYSTEM FOR FLEXOGRAPHIC PRINTING PLATE

(71) Applicant: MIRACLON CORPORATION, Oakdale, MN (US)

(72) Inventors: David Aviel, Minneapolis, MN (US); Fredrick Charles Mellema, Oakdale, MN (US); Andrew R. Williams, Buffalo, MN (US)

(73) Assignee: MIRACLON CORPORATION, Oakdale, MN (US)

( * ) Notice: Subject to any disclaimer, the term of this patent is extended or adjusted under 35 U.S.C. 154(b) by 367 days.

(21) Appl. No.: 17/893,782

(22) Filed: Aug. 23, 2022

(65) Prior Publication Data
US 2022/0413388 A1   Dec. 29, 2022

Related U.S. Application Data

(63) Continuation-in-part of application No. 15/861,781, filed on Jan. 4, 2018, now abandoned.

(51) Int. Cl.
*G03F 7/30* (2006.01)
*G03F 7/00* (2006.01)

(52) U.S. Cl.
CPC .......... *G03F 7/3057* (2013.01); *G03F 7/0015* (2013.01); *G03F 7/30* (2013.01); *G03F 7/3042* (2013.01)

(58) Field of Classification Search
CPC ... G03F 7/3057; G03F 7/0015; B05B 1/3006; B05B 1/3457; B05B 1/3473; B05B 11/007

See application file for complete search history.

(56) References Cited

U.S. PATENT DOCUMENTS

| 4,209,133 A | 6/1980 | Mehoudar |
| 4,281,798 A | 8/1981 | Lemelstrich |

(Continued)

FOREIGN PATENT DOCUMENTS

| EP | 0383314 | 8/1990 |
| EP | 0586470 | 3/1998 |

(Continued)

OTHER PUBLICATIONS

Machine Translation of JP03180847 (Year: 1991).*

(Continued)

*Primary Examiner* — Stephen D Meier
*Assistant Examiner* — Quang X Nguyen
(74) *Attorney, Agent, or Firm* — Maschoff Brennan

(57) ABSTRACT

A processing system for processing a flexographic printing plate can include a processing path for processing the flexographic printing plate. A hollow tube can be positioned to be extended across the processing path. A pressurized processing liquid supply system is provided. A plurality of pressure-compensating emitters are coupled to the hollow tube Each pressure-compensating emitter can include a casing having a fluidic flow path that is fluidly coupled with the hollow tube and having an outlet. Also, each emitter can include a resilient planar member in the casing and positioned to form at least one resilient surface of the fluidic flow path. Each pressure-compensating emitter is configured to control flow rate of the pressurized processing liquid to produce processing liquid drips from the outlet. The resilient planar member can be positioned to provide a variable outlet cross-sectional profile to the outlet in response to pressure inside the casing.

20 Claims, 13 Drawing Sheets

(56) References Cited

U.S. PATENT DOCUMENTS

| | | | |
|---|---|---|---|
| 4,294,533 A * | 10/1981 | Bratt | G03D 15/00 |
| | | | 118/259 |
| 4,971,253 A | 11/1990 | Lazarus | |
| 5,055,870 A | 10/1991 | Ohba et al. | |
| 5,124,736 A | 6/1992 | Yamamoto et al. | |
| 5,820,029 A | 10/1998 | Marans | |
| 5,828,923 A | 10/1998 | Harabin et al. | |
| 5,839,364 A | 11/1998 | Niemiro et al. | |
| 6,247,856 B1 | 6/2001 | Shibano et al. | |
| 6,371,025 B1 | 4/2002 | Dufour et al. | |
| 6,557,470 B1 | 5/2003 | Persson | |
| 6,622,335 B1 | 9/2003 | Anderson et al. | |
| 7,329,058 B1 | 2/2008 | Fromson et al. | |
| 8,142,987 B2 | 3/2012 | Ali et al. | |
| 8,399,177 B2 | 3/2013 | Stolt et al. | |
| 8,444,333 B2 | 5/2013 | Suzuki et al. | |
| 8,492,449 B2 | 7/2013 | Inoue et al. | |
| 8,511,586 B2 | 8/2013 | Einav et al. | |
| 8,714,845 B2 | 5/2014 | Suzuki et al. | |
| 8,945,813 B2 | 2/2015 | Kidnie | |
| 9,005,884 B2 | 4/2015 | Yawata et al. | |
| 9,250,527 B2 | 2/2016 | Kidnie | |
| 9,307,705 B2 | 4/2016 | Akritanakis | |
| 2003/0215957 A1 | 11/2003 | Lemmo | |
| 2006/0163388 A1 | 7/2006 | Mari | |
| 2008/0101792 A1 | 5/2008 | Fromson et al. | |
| 2009/0133888 A1 | 5/2009 | Danon | |
| 2009/0274979 A1 | 11/2009 | Teng | |
| 2015/0053103 A1 | 2/2015 | Fromson et al. | |
| 2015/0090815 A1 | 4/2015 | Akritanakis | |
| 2016/0250841 A1 | 9/2016 | Ruiz Sueza et al. | |
| 2017/0142916 A1 * | 5/2017 | Shamshery | B05B 1/3006 |
| 2018/0004092 A1 | 1/2018 | Swihart et al. | |
| 2019/0204745 A1 | 7/2019 | Aviel et al. | |
| 2021/0096467 A1 | 4/2021 | Aviel et al. | |
| 2022/0413388 A1 | 12/2022 | Aviel et al. | |

FOREIGN PATENT DOCUMENTS

| | | |
|---|---|---|
| EP | 0586483 | 11/1998 |
| EP | 1003079 | 5/2000 |
| GB | 1497267 | 1/1978 |
| GB | 1508375 | 4/1978 |
| JP | H02-18566 A | 1/1990 |
| JP | H02-216157 A | 8/1990 |
| JP | 03180847 | 8/1991 |
| JP | 2003257833 A | 9/2003 |
| JP | 2004-512555 A | 4/2004 |
| JP | 2005345944 | 12/2005 |
| WO | 2009/002520 | 12/2008 |
| WO | 2014/114900 | 7/2014 |
| WO | 2020/095291 A1 | 5/2020 |

OTHER PUBLICATIONS

Machine Translation of JP2005345944 (Year: 2005).*

Rain Bird Landscape Drip Products brochure: http://www.rainbird.com/documents/thip/bro Landscape DripProducts.pdf.

European Patent Office; International Search Report and Written Opinion issued in Int'l App No. PCT/US2018/067013 dated Mar. 21, 2019.

International Search Report and Written Opinion of the International Searching Authority dated Feb. 22, 2024 as received in Application No. PCT/US2023/030852.

Japanese Office Action issued in corresponding application No. 2020-536577, dated Aug. 2, 2022.

* cited by examiner

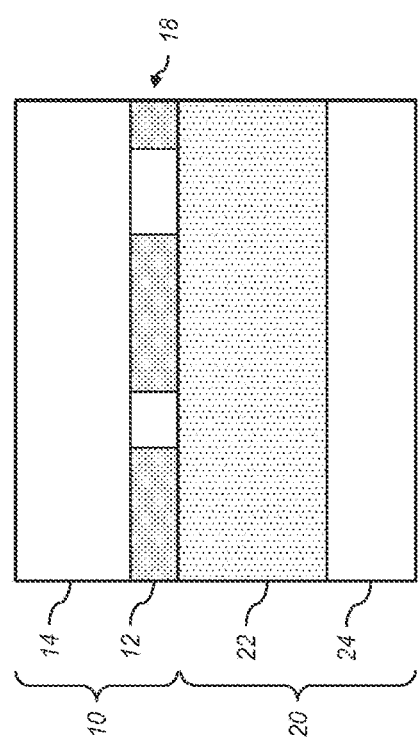

REDUCED FLOW RATE PROCESSING SYSTEM FOR FLEXOGRAPHIC PRINTING PLATE

CROSS-REFERENCE TO RELATED APPLICATIONS

This patent application is a continuation-in-part of U.S. patent application Ser. No. 15/861,781 filed Jan. 4, 2018, which application is incorporated herein by specific reference in its entirety.

U.S. GOVERNMENT RIGHTS

This invention was made with government support under CA191785 awarded by the National Institutes of Health. The government has certain rights in the invention.

BACKGROUND

Field

This invention pertains to the field of flexographic printing, and more particularly to a pressure-compensating emitter and method of using the pressure-compensating emitter to reduce water usage during production of flexographic printing plates.

Description of Related Art

Relief printing plates, such as flexographic plates, falls into two main categories: (1) those that are processed using aqueous solutions to remove unexposed photopolymer, and (2) those that need to be processed using some other chemical solvent. In recent years, flexographic printing plates using an aqueous-processable photopolymer are gaining more market interest because of their environmentally-friendly characteristics. They have the additional advantage that they can reduce organic solvent exposure at the workplace. Aqueous-processable printing plates are sometimes referred to as aqueous-washable printing plates because the processing typically involves washing off the unexposed photopolymer. There are also two main types of aqueous-processable flexographic printing plates: (1) those that are processable by dissolution of the photopolymer using a strong alkaline solution (i.e., having a pH>11), and (2) those that are processable by dispersion of the photopolymer using a processing solution including a dispersing agent (typically having a pH<11).

Aqueous-processable flexographic printing plates may be processed (i.e., "washed") by a number of methods. For example, U.S. Pat. No. 5,124,736 (Yamamoto et al.), entitled "Process and apparatus for developing photopolymer plate," describe systems which form the relief by spraying processing solution (i.e., "washout solution") under pressure onto the printing plate, and systems which form the relief by rubbing a brush against the printing plate in the presence of the processing solution, thereby dissolving the unexposed portions in the processing solution. Yamamoto et al., describe a system in which processing solution is filtered and recirculated to the plate processor after a full batch of platemaking.

As noted by U.S. Pat. No. 6,247,856 (Shibano et al.), entitled "Developing system of photosensitive resin plates and apparatus used therein," photopolymer (i.e., resin) can build up in the used processing solution after processing a number of printing plates. This can cause various problems, such as decreasing the speed of development, and the dispersed resin forming scum which adheres to the plates and the brush. This can require frequent disposal of the used processing solution and preparation of a fresh processing solution. Shibano et al. discloses the addition of fresh processing solution to a processing unit, while removing part of the resin-containing processing solution to keep the resin content of the processing solution substantially constant.

In order to remove debris that becomes attached to the surface of the printing plate, a rinsing station can be employed after the main plate processing step. U.S. Patent Application Publication No. 2009/0013888 (Danon), entitled "Methods and means relating to photopolymer printing plates," discloses processing a printing plate using a processing solution, followed by rinsing with water in a rinsing station. Used processing solution is recycled back to the processor after filtration. Waste water from the rinsing station may also be recycled back to the processor after filtration.

U.S. Pat. No. 5,828,923 (Harabin et al.), entitled "Apparatus and method for processing water wash photopolymer solution," disclose directing used processing solution into a holding tank, and adding a coagulant to coagulate the solid content for disposal.

European Patent 0586470B1 (Danon), entitled "Preparation of photopolymerised elastomeric printing plates" disclose a processing system including (a) a wash-out section where unexposed areas of the plate are removed; (b) a rinse section; (c) an excess water-removing section; (d) a light-finishing section where the plate is exposed by UV light to reduce the stickiness of the plate surface; and (e) a drying section.

European patent 0586483B1 (Danon), entitled "Method and Apparatus for washing-out printing plates," discloses a system for processing printing plates where processing solution is directed through a spray bar along downwardly directed bristles of a washout brush.

It has been found that even when utilizing a plate processor that includes a rinse operation, such as that disclosed in the aforementioned U.S. Patent Application Publication No. 2009/0013888, there can still be significant problems with plate defects after the production of only a few plates. The occurrence of plate defects is particularly problematic with the increasingly popular photopolymer plates with include micro-texture on the raised plate surface (i.e., the printing surface). As discussed in U.S. Pat. No. 8,399,177 (Stolt et al.), entitled "Enhanced printing plate," the micro-texture is beneficial to enhance print density and uniformity. In such cases, the debris particles tend to accumulate on the micro-texture surface of the printing plate, which results in unacceptable print defects after processing a small number of printing plates.

It is desirable to minimize the amount of processing solution required to process the printing plates in order to reduce costs and reduce the volume of used solution that must be disposed of. However, prior art processing systems have been found to require relatively high flow rates of processing solution in order to maintain a high quality level. There remains a need for an improved processing system for processing flexographic printing plates that requires lower flow rates of processing solution.

SUMMARY

In some embodiments, a processing system for processing a flexographic printing plate is provided. The processing system can include a processing path configured for processing the flexographic printing plate. A hollow tube having a length can be positioned to be extended across the processing path, which can be at an angle, such as orthogonal. A pressurized processing liquid supply system is provided (e.g., with at least one pump) for supplying pressurized processing liquid into an interior of the hollow tube. A plurality of pressure-compensating emitters are coupled to the hollow tube and distributed along the length of the hollow tube. For example, there can be about 33 pressure-compensating members, or +/−10, 8, 5, 2, or 1 or other integer. Each pressure-compensating emitter can include a casing having a fluidic flow path that is fluidly coupled with the hollow tube and having an outlet. Also, each emitter can include a resilient planar member in the casing and positioned to form at least one resilient surface of the fluidic flow path. In some aspects, each pressure-compensating emitter is configured to control flow rate of the pressurized processing liquid to produce processing liquid drips from the outlet. In some aspects, the resilient planar member is positioned to provide a variable outlet cross-sectional profile to the outlet in response to pressure inside the casing.

In some embodiments, the casing and resilient planar member define a fluidic flow path (e.g., channel, conduit, tunnel, etc.) is a tortuous flow path configured to cause a pressure drop in the pressurized processing liquid. In some aspects, the tortuous flow path is formed by one or more flow direction changing members that form a change in direction in the tortuous flow path. In some aspects, the one or more flow direction changing members include a plurality of first members projecting partially into the fluidic flow path from at least one side thereof along a length of the tortuous flow path to cause liquid flowing through the fluidic flow path to undergo repeated first directional changes. In some aspects, the one or more flow direction changing members include a plurality of second members projecting partially into the fluidic flow path and projecting at an angle relative to the first members and arranged along a length of the tortuous flow path to cause liquid flowing through the fluidic flow path to undergo repeated second directional changes at an angle relative to the first directional changes.

In some embodiments, the resilient planar member is an elastomer, rubber, or other resilient material, such as a membrane, that is configured and positioned for regulating flow of the pressurized processing liquid through the outlet to a predetermined and substantially constant flow rate over a range of water pressures at the inlet.

In some embodiments, the outlet includes an upwardly open discharge regulating groove through which processing fluid flows from the fluidic flow path to the outlet, and the resilient planar member is positioned to be overlying and engaging the groove so as to form a pressure compensating means for regulating fluid flow from the fluidic flow path to the outlet. In some aspects, the resilient planar member is a resilient valve member disposed within an interior of the casing in a position to overlie a flow path pattern to form the flow path channel. The resilient valve member can be positioned to cooperate with the flow path pattern to define an elongated pressure reducing flow path with an upstream end in flow communication with the hollow tube and a downstream end in flow communication with the outlet.

In some embodiments, the system can include one or more brushes extending across the processing path with the hollow tube. The plurality of pressure-compensating emitters are positioned and configured deliver the processing liquid as liquid drips onto the one or more brushes.

In some embodiments, a method for processing a flexographic printing plate having a relief image is provided. The method can include providing a relief image into a processing unit that processes the flexographic printing plate with a processing liquid. The processing unit can be configured with the processing path with the hollow tube and pressure-compensating emitters of an embodiment described herein. The method can include emitting the processing liquid as drips from the plurality of pressure-compensating emitters. The drippings from the emitters can be used for washing the relief image with the processing liquid from the processing liquid drips.

In some embodiments, the method can include applying the processing liquid as drips to one or more brushes which move relative to the surface of the flexographic printing plate. The one or more brushes can be positioned and configured to apply the processing liquid to the relief image.

In some embodiments, the pressure-compensating emitters can regulate fluid flow so that the flow rate of the processing liquid drips from each pressure-compensating emitter is equal to within 30% of one another. In some aspects, the flow rate of the processing liquid drips from each of the pressure-compensating emitters is less than 0.1 liters/minute. In some aspects, the processing liquid drip rate is about 0.076 liter/minute per 33 pressure-compensating emitters, or about 0.0023 liters/minute. The liquid drip rate can be about 0.0010 to about 0.0035 liters/minute, or from about 0.002 to about 0.003 liters per minute. The number of pressure-compensating members can be integer but can range from 10 to 50 emitters, 15 to 45 emitters, 20 to 40 emitters, or 25-35 emitters.

In some embodiments, the processing liquid is an aqueous processing solution including a dispersing agent. In some aspects, the processing liquid includes a solvent. In some aspects, the processing liquid is water. In some aspects, the pressurized processing liquid supply system pressurizes the processing liquid to about 30-60 psi (0.2 MPa to 0.41 MPa).

In some embodiments, the resilient planar member is a resilient valve member disposed within an interior of the casing in a position to overlie a flow path pattern. The resilient valve member is positioned and configured for cooperating with the flow path pattern to define an elongated pressure reducing flow path with an upstream end in flow communication with the hollow tube and a downstream end in flow communication with the outlet. In some aspects, the outlet includes an upwardly open discharge regulating groove through which processing fluid flows from the fluidic flow path to the outlet, the resilient planar member overlying and engaging the groove to form a pressure compensating means for regulating fluid flow from the fluidic flow path to the outlet.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIGS. 1A-1D illustrate the steps involved with forming a flexographic printing plate according to an exemplary process.

It is to be understood that the attached drawings are for purposes of illustrating the concepts of the invention and may not be to scale. Identical reference numerals have been used, where possible, to designate identical features that are common to the figures.

Figure 1A:
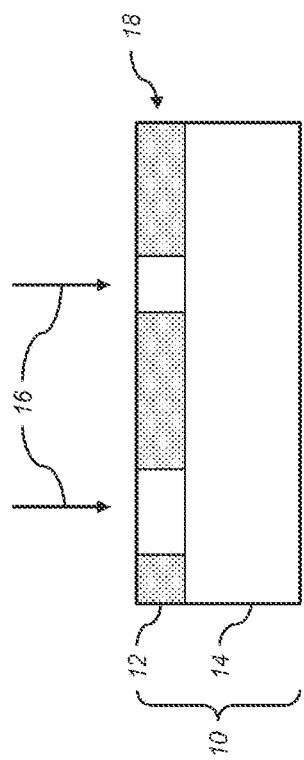

The elements and components in the figures can be arranged in accordance with at least one of the embodiments described herein, and which arrangement may be modified in accordance with the disclosure provided herein by one of ordinary skill in the art.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

The present invention represents a processing system for processing a flexographic printing plate which moves along a processing path in an in-track direction, including: a processing unit that processes the flexographic printing plate with a processing liquid including: a hollow tube having a length extending across a cross-track dimension of the flexographic printing plate; a processing liquid supply system for supplying pressurized processing liquid into an interior of the hollow tube; and a plurality of pressure-compensating emitters distributed along the length of the tube which deliver processing liquid onto a surface of the flexographic printing plate, wherein processing liquid flows from the interior of the hollow tube through the pressure-compensating emitters at a controlled flow rate. This invention has the advantage that a uniform flow of processing solution can be obtained across the width of the printing plate at a reduced total flow rate. It has the further advantage that printing plates can be processed using a lower volume of processing solution which reduces processing solution costs and processing solution disposal costs.

In accordance with the present invention, flexographic printing plates are formed by applying an aqueous processing solution to photosensitive flexographic printing plate precursors having latent images formed in an aqueous-processable photopolymer. In an exemplary embodiment, the photosensitive flexographic printing plates are similar to those described in U.S. Pat. No. 8,492,449 No. (Inoue et al.), entitled "Photosensitive resin composition, printing plate precursor and flexographic printing plate." However, the described processing system and method is applicable to other types of aqueous-processable printing plates, including other types of aqueous-processable relief printing plates (e.g., letterpress printing plates).

Before processing, a latent image is formed on the photosensitive flexographic printing plate using any appropriate method known in the art. In an exemplary embodiment, the latent image is formed using a mask image as described in commonly-assigned U.S. Pat. No. 9,250,527 (Kidnie), entitled "Mask forming imageable material and use," which is incorporated herein by reference. This method is illustrated in FIGS. 1A-1D.

FIG. 1A illustrates a mask material 10, which includes a mask layer 12 on a substrate 14. In an exemplary embodiment, the mask material 10 is the commercially-available Kodak Flexcel NX Thermal Imaging Layer material. Further information about such mask materials 10 can be found in the aforementioned U.S. Pat. No. 9,250,527. The mask layer 12 is opaque to the radiation that will be used to expose the photosensitive flexographic printing plate (e.g., to UV radiation). The mask material 10 is exposed to radiation 16 in an image-wise fashion to form a mask image 18 in the mask layer 12. The mask image 18 will typically include patterns of halftone dots, lines, text and solid areas (with or without micro-surface patterning) according to the image content to be printed. In an exemplary embodiment, the radiation 16 is provided by a commercially-available Kodak Trendsetter NX Imager, which uses an infrared laser to ablate portions of the mask layer 12 where it is desired to produce raised features on the flexographic printing plate.

As illustrated in FIG. 1B, the mask material 10 is now laminated to a photosensitive printing plate 20. The photosensitive printing plate 20 includes a photosensitive photopolymer layer 22 over a substrate 24. The mask material 10 is laminated such that the mask layer 12 having the mask image 18 faces the photopolymer layer 22. In an exemplary embodiment, the photosensitive printing plate 20 is of a type similar to those described in the aforementioned U.S. Pat. No. 8,492,449 (Inoue et al.) (except that no antiadhesive layer is included over the photopolymer layer), and the lamination is performed (after removing the cover film from the photosensitive printing plate 20) using a commercially-available Kodak Flexcel NX laminator so that the mask material 10 is in an intimate contact with the photopolymer layer 22 of the photosensitive printing plate 20.

Figure 1C:
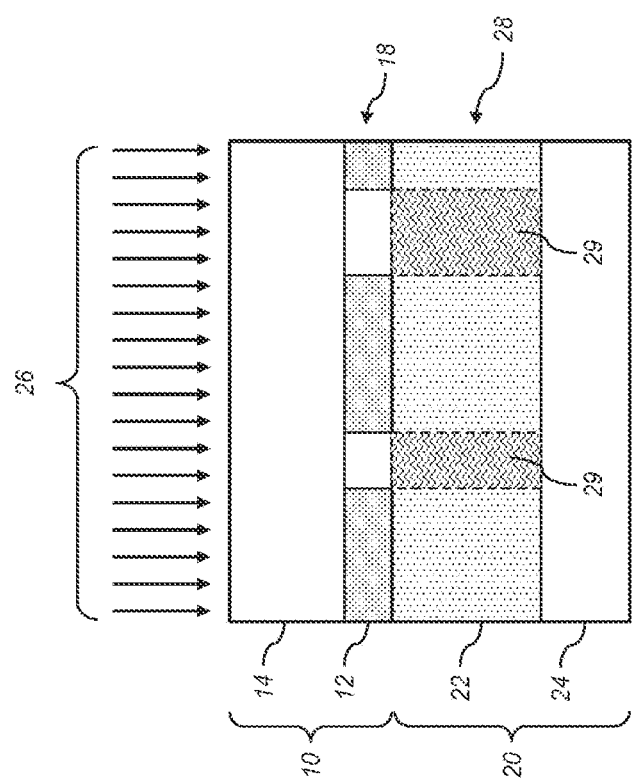

In FIG. 1C, the laminated photosensitive printing plate 20 is exposed to radiation 26 to form a latent image 28 in the photopolymer layer 22. Various commercially available UV exposure devices may be used to perform this operation. In an exemplary embodiment, the radiation 26 is UV radiation supplied by a commercially-available Concept 302 EDLF system available from Mekrom Engineering. Where the mask image 18 has been ablated, the radiation 26 passes through the mask layer 12 and exposes the photopolymer layer 22, thereby cross-linking and hardening the photopolymers to provide a developable latent image 28 including cross-linked polymer regions 29. The UV exposure 26 can be provided at a wide range of temperatures from about room temperature up to 60 C. However, it has been found that UV radiation exposure performed at elevated temperatures in the range of 42 C-52° C. provides better final plate quality (e.g., improved minimum dot holding and better resolution of surface micro-textures).

Figure 1D:
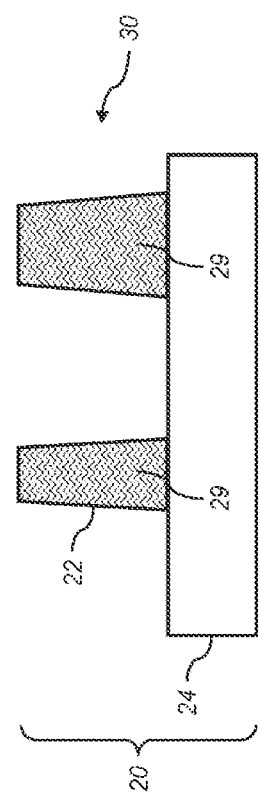

After the latent image 28 has been formed, the mask material 10 is removed, and the photosensitive printing plate 20 is processed to provide a developed relief image 30 as illustrated in FIG. 1D. The processing operation (sometimes referred to as "developing the printing plate") involves removing the unexposed portions of the photopolymer layer where were not hardened by the radiation 26 (FIG. 1C) leaving the cross-linked polymer regions 29. In accordance with the present invention, the photopolymer layer 22 is made of an aqueous-processable photopolymer so that the processing operation uses an aqueous processing solution (i.e., a water-based processing solution), typically including an active ingredient such as a dispersing agent. Aqueous processing solutions are generally preferred to processing solutions using other solvents (e.g., organic solvents) because of their environmentally-friendly characteristics.

Figure 2:
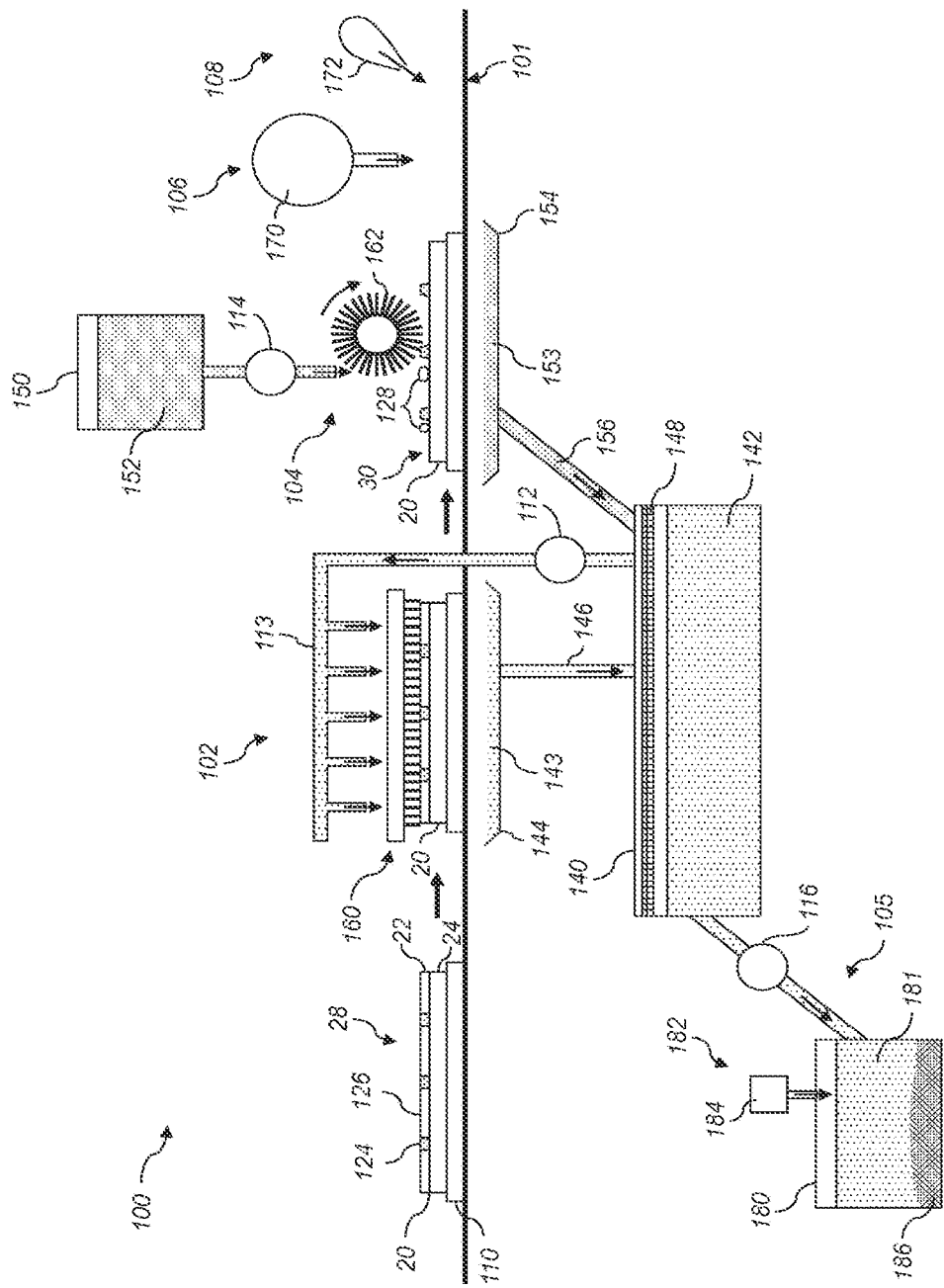
FIG. 2 shows a schematic diagram of a system for processing a photosensitive flexographic printing plate.

FIG. 2 shows a schematic diagram of an exemplary processing system 100 for processing an aqueous-processable photosensitive printing plate 20 in accordance with the present invention. In an exemplary embodiment, the photosensitive printing plate 20 is of a type similar to those described in the aforementioned U.S. Pat. No. 8,492,449 (Inoue et al.) (except that no antiadhesive layer is included over the photopolymer layer). However, other types of aqueous-processable printing plates can also be used.

In the exemplary arrangement of FIG. 2, the plate processing takes place as an "in-line process" where the photosensitive printing plate 20 proceeds through the processing system 100 along a processing path 101 where a series of processing operations are applied. In alternate embodiments, the plate processing can be performed as a "batch process", where after the main plate processing, the plate moves in the reverse direction and the secondary processing takes place similar to the in-line process.

In an exemplary arrangement, the photosensitive printing plate 20 is mounted on a platen 110 as it is moved along the processing path 101. The input to the processing system 100 is a photosensitive printing plate 20 having a latent image 28 formed by exposing the photopolymer layer 22. The latent image 28 includes exposed portions 124 where the photopolymer layer 22 has been hardened by exposure to appropriate actinic radiation, and unexposed portions 126 where the photopolymer layer 22 remains soft and is to be removed from the substrate 24 during processing.

Main processing unit 102 is used to develop the latent image 28 into a relief image 30 by removing the unexposed portions 126 of the photopolymer layer 22 from the photosensitive printing plate 20. The main processing unit 102 can also referred to as a processing station or a development unit/station. The main processing unit 102 includes a pump 112 for drawing aqueous processing solution 142 from a processing solution tank 140 and directing it through a series of pipes 113 to bring the aqueous processing solution 142 into contact with the photosensitive printing plate 20.

The aqueous processing solution 142 includes a dispersing agent (i.e., "soaps") to aid in the removal of the unexposed photopolymer. Any appropriate dispersing agent known in the art can be used in accordance with the present invention. Some examples of appropriate dispersing agents are discussed in U.S. Pat. No. 9,005,884 (Yawata et al.), entitled "Developer composition for printing plate, developer and method for manufacturing printing plate," which is incorporated herein by reference. In one example, the dispersing agent is a salt of fatty acid, preferably having an average carbon number in the range of 10-20. In another example, the dispersing agent is a sulfonate, such as an alkylbenzene sulfonate having an average carbon number in the range of 8-16, or an –α-olefin sulfonate having an average carbon number in the range of 10-20. In a preferred embodiment, the aqueous processing solution 142 is heated to a predetermined value between 40 C to 60 C.

In a preferred configuration, the main processing unit 102 includes a mechanical cleaning system 160 to aid in removing the unexposed photopolymer from the photosensitive printing plate 20. The mechanical cleaning system 160 typically includes one or more brushes which contact the photopolymer layer 22 of photosensitive printing plate 20 while it is in contact with the aqueous processing solution 142. The brushes are preferably moved relative to the photosensitive printing plate 20, for example in a side-to-side motion or an orbital motion.

Various brush configurations can be used in accordance with the present invention. For example, the brushes can be downward facing as shown in FIG. 2. Examples of downward-facing brush configuration are shown in European Patent No. 0586483B1, European Patent No. 0586470B1, and U.S. Pat. No. 8,444,333 (Suzuki et al.), each of which is incorporated herein by reference. Alternatively, the brushes can be upward facing such as in the configurations described in U.S. Pat. No. 5,124,736 (Yamamoto et al.) and U.S. Pat. No. 6,247,856 (Shibano et al.), each of which are incorporated herein by reference.

A collection system 144 is used to collect the used aqueous processing solution 143 and return it to the processing solution tank 140 through a conduit 146. The used aqueous processing solution 143 will contain the photopolymer that was removed from the unexposed portions 126 of the photopolymer layer 22. The used aqueous processing solution 143 is preferably passed through a filter 148 to remove larger particles of the removed photopolymer. In an exemplary embodiment, the filter 148 is a coarse fabric-type filter material having a pore size of about 100 μm similar to that described in WO 2014/114900 A2 (Danon), entitled "Processing waste washout liquid." In some configurations, the filter 148 is supplied in a rolled format, and the filter material is advanced during operation of the processing system 100 to provide fresh filter material. The used filter material containing the photopolymer particles is collected on a take-up roll.

The main processing unit 102 removes the majority of the unexposed photopolymer from the photosensitive printing plate 20 to provide the relief image 30. However, it has been observed that debris 128 is typically present on the surface of the relief image 30. The debris 128 is primarily made up of residual particles of photopolymer that were not washed off the surface of the photosensitive printing plate 20.

A secondary processing unit 104 is used to wash the developed relief image 30 with a secondary aqueous processing solution 152 supplied from a supply tank 150 to remove the remaining debris 128. The secondary processing unit 104 can also be referred to as a secondary processing station, a secondary developing unit/station or a washing unit/station. Preferably, a pump 114 is used to direct the secondary aqueous processing solution 152 onto the photosensitive printing plate 20 under pressure, bringing it into contact with the developed relief image 30. The pump 114 can be positioned anywhere to provide pressure to the secondary aqueous processing solution 152 or any fluid in the supply tank 150.

In a preferred embodiment, an optional mechanical cleaning system 162, such as a rotating brush, is used to enhance the performance of the secondary processing unit 104 by supplementing the washing action of the secondary aqueous processing solution 152 with mechanical cleaning.

Some prior art systems, utilize a water rinsing operation to clean the surface of the developed relief image 30. However, rather than being a simple water rinse, the secondary aqueous processing solution 152 used in the secondary processing unit 104 of the present invention includes an active ingredient (i.e., a dispersing agent) to aid in the removal of the debris 128. The secondary aqueous processing solution 152 is unused, meaning that it has not previously been used to process a photosensitive printing plate 20 and therefore contains no photopolymer. It has been found that this substantially improves the effectiveness of removing the debris 128. In a preferred embodiment the secondary aqueous processing solution temperature is between 40 C-55 C.

Any appropriate dispersing agent can be used in the secondary aqueous processing solution 152 such as those that were discussed earlier relative to the aqueous processing solution 142. In an exemplary configuration, the dispersing agent in the secondary aqueous processing solution 152 is the same as the dispersing agent used in the aqueous processing solution 142 used in the main processing unit 102. In other configurations, the dispersing agent in the secondary aqueous processing solution 152 can be different than the dispersing agent used in the aqueous processing solution 142.

In an exemplary configuration, the concentration of the dispersing agent in the secondary aqueous processing solution 152 is the same as the initial concentration of the dispersing agent in the aqueous processing solution 142 used in the main processing unit 102. In other configurations, the concentration of the dispersing agent in the secondary aqueous processing solution 152 can be greater than (or less than) the concentration of the dispersing agent in the aqueous processing solution 142.

A collection system 154 collects the used secondary aqueous processing solution 153 from the secondary processing unit 104 and directs it into the processing solution tank 140 through a conduit 156. This has the advantage that it replenishes the used aqueous processing solution 143 that can contain large amounts of photopolymer with the fresher used secondary aqueous processing solution 153 from the secondary processing unit 104 which will contain only small amounts of photopolymer (i.e., the removed debris 128).

A processing solution removal system 105 is used to remove aqueous processing solution 142 from the processing solution tank 140 and direct it into a holding tank 180. This enables the volume of the aqueous processing solution 142 in the processing solution tank 140 to be maintained below a predefined maximum volume as the used secondary aqueous processing solution 153 is added to the processing solution tank 140. In an exemplary configuration, the processing solution removal system 105 uses a pump 116 to pump the aqueous processing solution 142 from the processing solution tank 140 into the holding tank 180. Preferably, the amount of aqueous processing solution 142 removed from the processing solution tank 140 is equal to the amount of used secondary aqueous processing solution 153 that is added to the processing solution tank 140 so that the total volume of aqueous processing solution 142 in the processing solution tank 140 remains approximately constant. In some embodiments, the pump 116 is operated on a predefined schedule (e.g., after processing each photosensitive printing plate 20). In other embodiments, the pump 116 can be operated when it is detected that the volume of aqueous processing solution 142 in the processing solution tank 140 is detected to exceed a predefined threshold.

The removal of the aqueous processing solution 142 by the processing solution removal system 105 in combination with the addition of the used secondary aqueous processing solution 153 from the secondary processing unit 104 enables the concentration of photopolymer in the aqueous processing solution 142 in the processing solution tank 140 to be maintained below a predefined maximum photopolymer concentration. Without this replenishment process, it has been found that the concentration of the photopolymer in the aqueous processing solution 142 in the processing solution tank 140 quickly builds up to an unacceptable level which detrimentally effects the performance of the processing system 100 after only processing a few (e.g., five or less) photosensitive printing plates 20. However, using the described replenishment process it has been found that acceptable performance can be maintained even after processing a large number (e.g., more than 50) photosensitive printing plates 20.

The aqueous processing solution 142 operates optimally within a defined pH range. The presence of the photopolymer in the used aqueous processing solution 143 can change the pH of the solution thereby reducing its effectiveness. The described process including the removal of the aqueous processing solution 142 by the processing solution removal system 105 in combination with the addition of the used secondary aqueous processing solution 153 from the secondary processing unit 104 enables the pH of the aqueous processing solution 142 in the processing solution tank 140 to be maintained within a predefined acceptable pH range for processing a larger number of photosensitive printing plates 20.

In the exemplary processing system 100, after the photosensitive printing plate 20 has been processed by the secondary processing unit 104, it is rinsed using a rinsing unit 106 which directs a stream of water 170 onto the surface of the developed relief image 30. This water rinsing is used to remove any residual processing solution from the surface of the photosensitive printing plate 20. The photosensitive printing plate 20 is then dried using a drying unit 108. In an exemplary configuration, the drying unit 108 uses an air knife 172 to direct a stream of air onto the surface of the developed relief image 30.

At some point, it is necessary to discard the waste processing solution 181 collected in the holding tank 180. In an exemplary configuration, a coagulant supply system 182 can be used to add an appropriate coagulant 184 to the waste processing solution 181 to coagulate the polymer in the waste processing solution 181. The resulting solid coagulated polymer 186 can then be removed from the solution and discarded in an appropriate manner. The remaining waste processing solution 181 can then be disposed of in most locations without any significant environmental concerns. Examples of coagulants 184 that can be used to produce the coagulated polymer 186 include Bentonite clay (such as commercially available RM-10 from Cetco), Alum (potassium aluminum sulphate), aluminum sulphate, strong acids (such as hydrochloric acid), ferric chlorides, and many other chemicals commonly used in waste water treatment. Bentonite Clay RM-10 is particularly preferred.

Figure 3:
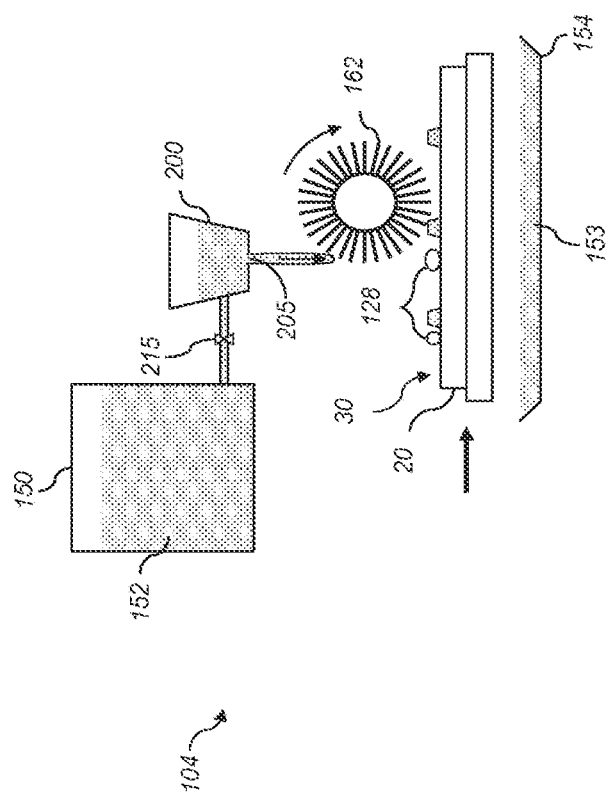
FIG. 3 illustrates a conventional processing unit incorporating a trough-based liquid distribution system.

In some prior art processing systems, the secondary processing unit 104 includes a fluid distribution trough 200 which distributes the processing solution 152 across the width of the printing plate 20 as illustrated in FIG. 3. Distribution of the processing solution 152 can be implemented by releasing processing solution 152 from a supply tank which may be at or above atmospheric pressure into the trough 200. In other configurations, rather than using a supply tank, a dosing pump (such as the Dosatron D14MZ10 available from Dosatron International of Clearwater, Fla.) can be used to mix the processing agent directly into a pressurized water supply to provide the processing solution 152. The total flow rate (i.e., the flow amount per unit of time) is restricted by an orifice such as a valve 215 (e.g., a flow control valve or a needle valve). The trough 200 is equipped with small holes 205 at its bottom. The processing solution 152 drips through the holes 205 by gravity force and flows onto the printing plate 20. In an exemplary configuration, a mechanical cleaning system 162 such as a rotating brush is used to assist in removal of debris 128 from the printing plate 20. While not shown, a pump (e.g., 114) can be used to pressurize the supply tank 15 and the processing solution 152 therein.

Figure 4:
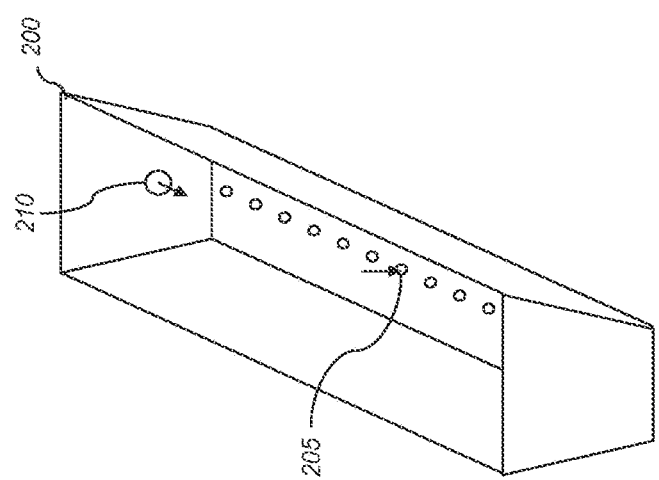
FIG. 4 shows additional details of the trough of FIG. 3.

FIG. 4 shows additional details of the trough 200. A plurality of holes 205 are distributed along a length of the trough 200 to provide processing solution 152 across a cross-track width of the printing plate 20 (FIG. 3). The processing solution 152 flows into the trough 200 through an inlet 210 and is distributed along the length of the trough 200 at atmospheric pressure by gravity force where it drips through the holes 205. A disadvantage of this design is that as the total flow rate is decreased to reduce waste, differences in the drip rate of the processing solution 152 from the holes 205 become significant. As a result, liquid discharge across the printing plate 20 becomes uneven to a level that causes defects. In some cases, the holes 205 farthest from the inlet 210 may completely stop dripping. Further, as total flow rate is decreased, any lack of levelness of the distributing trough 200 negatively impacts the evenness of drip rate through the holes 205. In some processing systems, a pipe having a series of holes is used rather than a trough 200. Since the pipe is supplied with processing solution at atmospheric pressure such configurations suffer from the same disadvantages that were just discussed.

Examples of processing systems that utilize a liquid distribution system similar to that shown in FIGS. 3-4 include water wash systems such as the Dantex DigiWash models DW2735, DW4835, DW4260 and solvent processing systems such as the Vianord EVO 5BP and the Glunz & Jensen Concept 505 DW.

Figure 5:
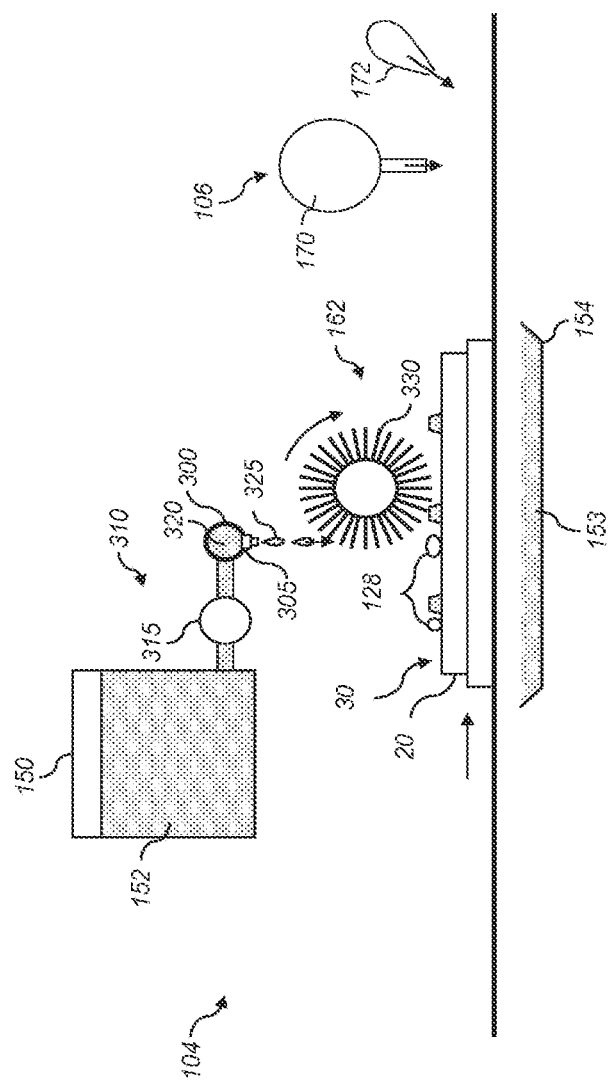
FIG. 5 shows an improved processing unit incorporating a plurality of pressure-compensating emitters according to an exemplary embodiment.

FIG. 5 illustrates an improved processing unit 104 that overcomes the disadvantages of the prior art configuration described relative to FIGS. 3-4. In the improved configuration, the trough 200 containing processing solution 152 at atmospheric pressure of FIG. 3 is replaced by a hollow tube 300 which is supplied with pressurized processing solution 320. The pressurized processing solution 320 is supplied to the interior of the hollow tube 300 by a processing liquid supply system 310. In an exemplary embodiment, the processing liquid supply system 310 includes a pump 315. The pump 315 can be used to pressurize the processing solution 152; however, this pump 315 or other pump can be placed in connection with the supply tank 150 or the hollow tube 300. In some instances the pump 315 can be a dosing pump, such as the Dosatron D14MZ10, which adds processing agent into a pressurized water supply. Typically, the pressurized water supply supplies water at pressures of 30-60 psi. A plurality of pressure-compensating emitters 305 are distributed along the length of the hollow tube 300. The pressurized processing solution 320 flows from the interior of the hollow tube through the pressure-compensating emitters 305 at a controlled flow rate to produce processing solution drips 325 which flow onto the printing plate 20. The pressure-compensating emitters 305 are manufactured to provide a specified dripping rate over a wide range of pressures in the hollow tube 320.

Pressure-compensating emitters are well-known in the field of drip irrigation systems and such components can be adapted for use in the present invention. Examples of pressure-compensating emitters are described in U.S. Pat. No. 4,281,798 to Lemelstrich entitled "Drip or trickle emitter;" U.S. Pat. No. 4,971,253 to Lazarus entitled "Pressure compensating emitters for drip irrigation systems;" U.S. Pat. No. 5,820,029 to Marans entitled "Drip irrigation emitter;" and U.S. Pat. No. 9,307,705 to Akritanakis, entitled "Pressure compensating drip irrigation emitter." Pressure-compensating emitters 305 at a wide range of dripping rates are commercially available from a variety of suppliers including Rain Bird Corporation of Azusa, Calif. These patent documents describing the pressure-compensating emitters are incorporated herein by specific reference in their entirety.

As with the processing system 100 described relative to FIG. 2, a rinsing unit 106 can be used to rinse the printing plate 20 with water 170 after the processing unit 104 completes its processing operation, and an air knife 172 (i.e., a pressurized air system) can be used to blow any remaining liquid off the surface of the printing plate 20. In some embodiments, the rinsing unit 106 can also be equipped with a liquid supply system having a plurality of pressure-compensating emitters 305 distributed along the length of a hollow tube 300 as in processing unit 104.

Figure 6:
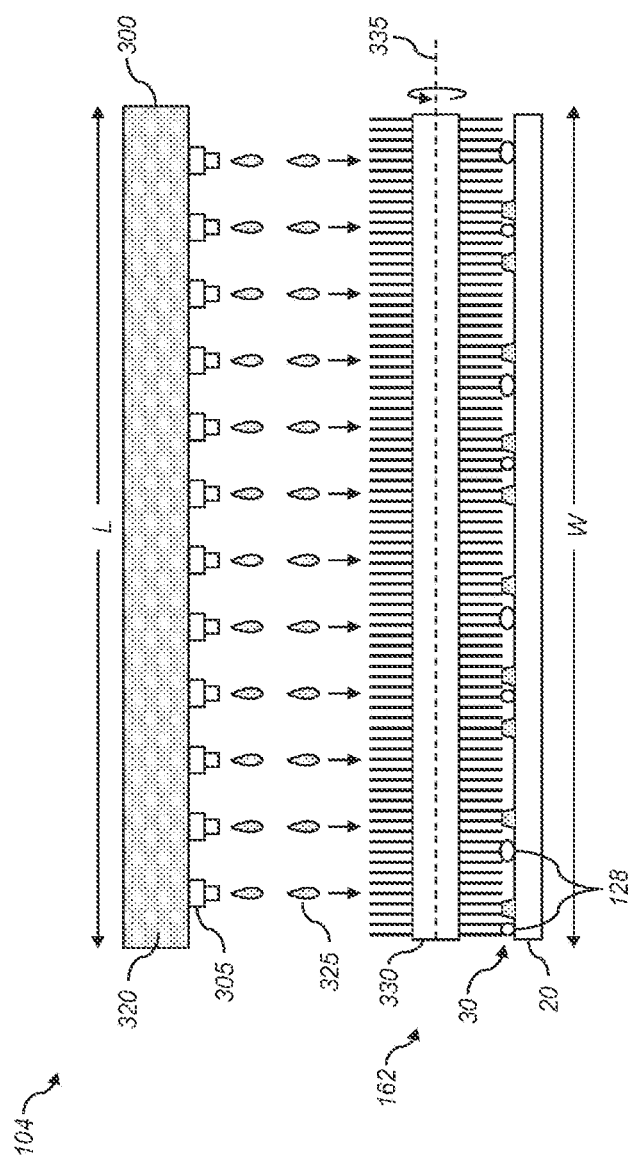
FIG. 6 shows additional details of the processing unit of FIG. 5.

Additional details of the processing unit 104 of FIG. 5 are illustrated in FIG. 6. The hollow tube 300 has a length L which extends across a cross-track width W of the printing plate 20. A plurality of pressure-compensating emitters 305 are distributed along the length of the hollow tube 300. The total flow rate of the processing solution through the processing unit 104 will be controlled by the dripping rate associated with the pressure-compensating emitters 305 together with the total number of pressure-compensating emitters 305. The total flow rate will be substantially independent of the internal pressure within the hollow tube 300 over a wide range of operating pressures.

Figure 7:
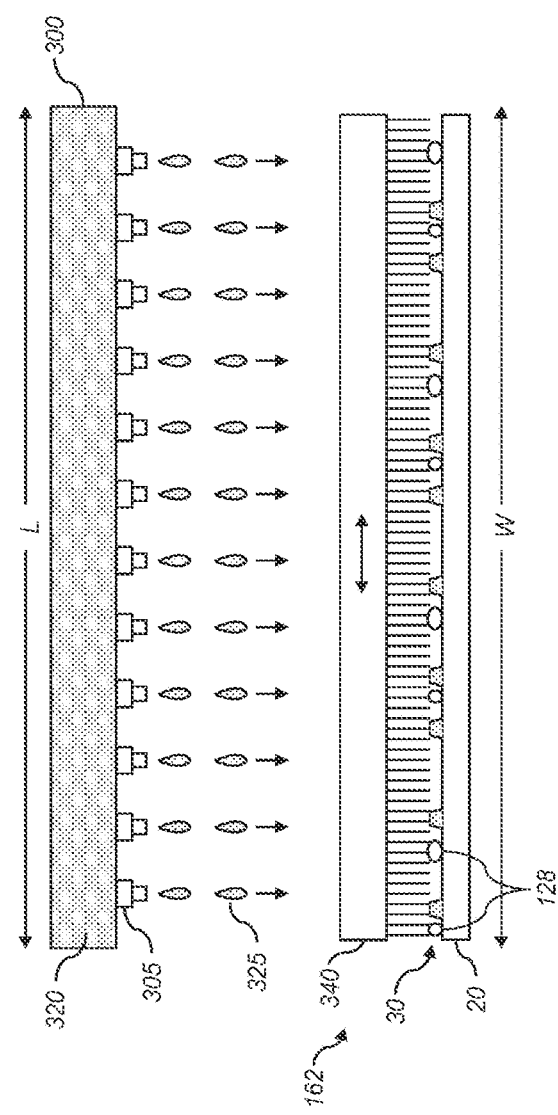
FIG. 7 illustrates an alternate embodiment incorporating a brush which is moved laterally.

In the configuration of FIG. 6, the processing solution drips 325 impinge onto a rotating brush 330 which rotates around a rotation axis 335 parallel to the surface of the printing plate 20. The rotating brush 330 carries the processing solution onto the printing plate 20 and aids in the removal of the debris 128 from the relief image 30. FIG. 7 shows an alternate configuration which uses a brush 340 which is translated laterally relative to the surface of the printing plate 20 using an oscillating motion.

An advantage of the present invention is that the flow rate through each of the pressure-compensating emitters 305 will be substantially equal (e.g., to within 30%) so that the processing solution will be applied uniformly across the cross-track width of the processing plate 20. Furthermore, the uniformity of the flow rate will be independent of the levelness of the hollow tube 300.

Figure 8A:
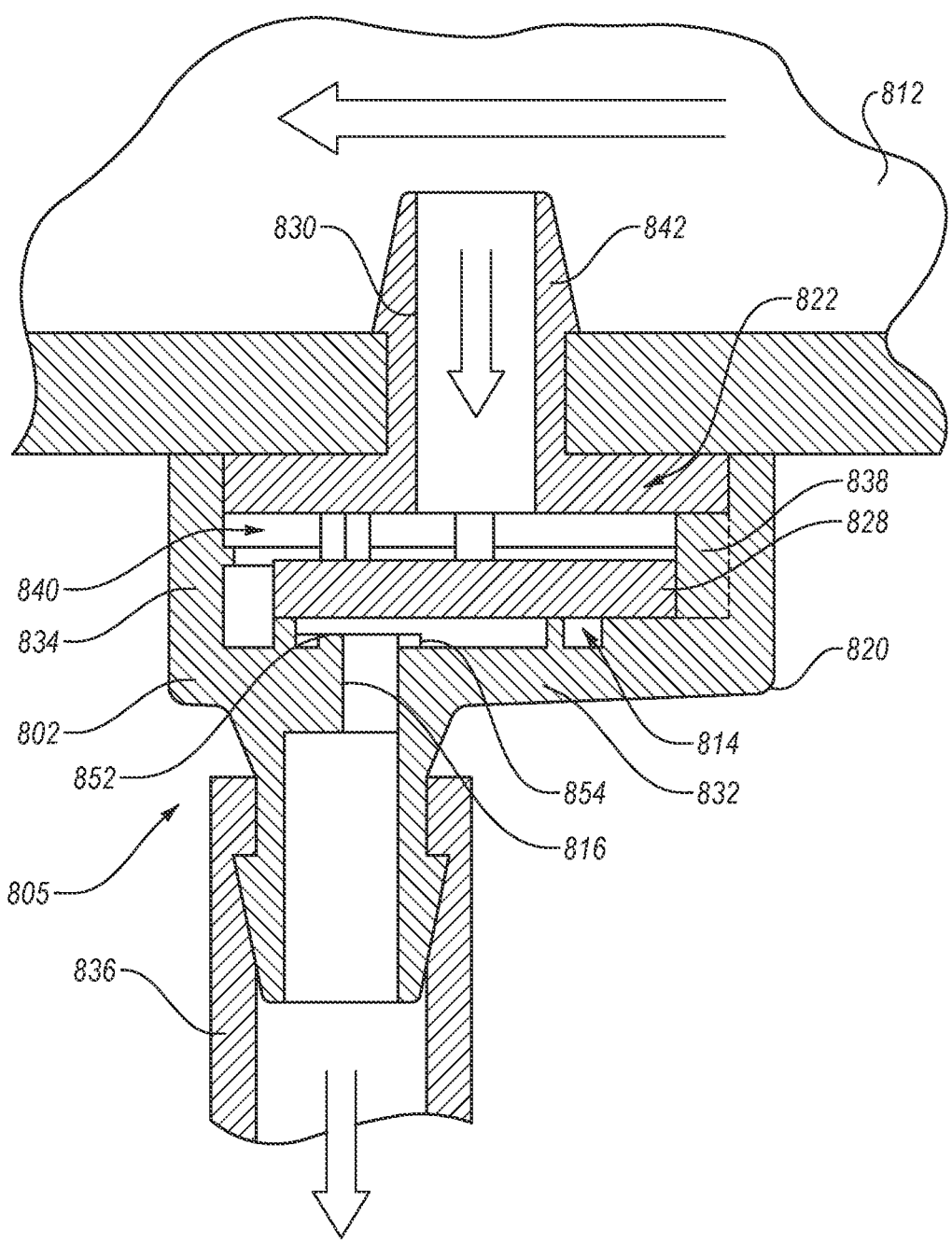
FIG. 8A illustrates a cross-sectional view of an embodiment of a pressure-compensating emitter.
Figure 8B:
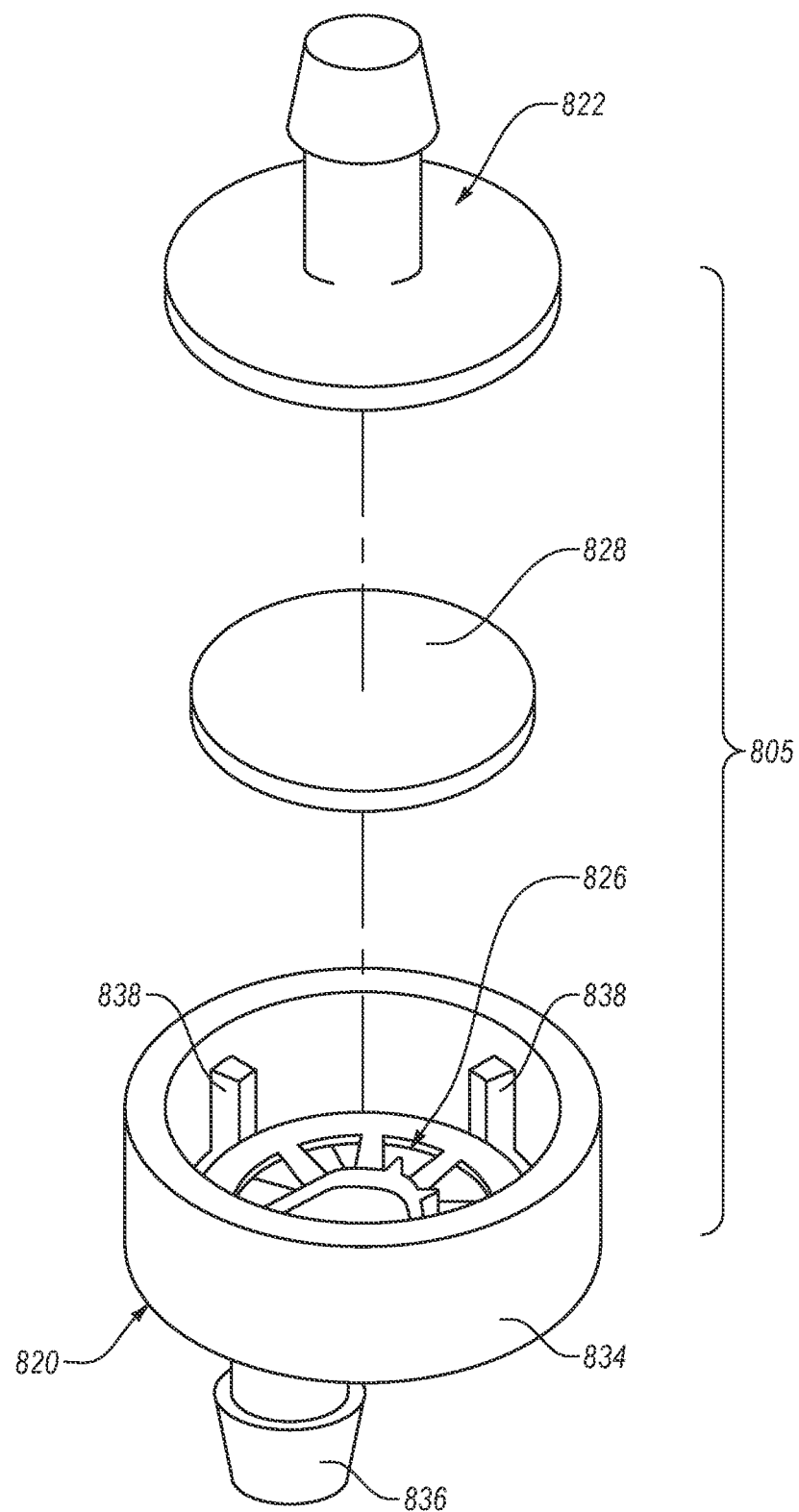
FIG. 8B illustrates an exploded view of the pressure-compensating emitter of FIG. 8A.
Figure 8C:
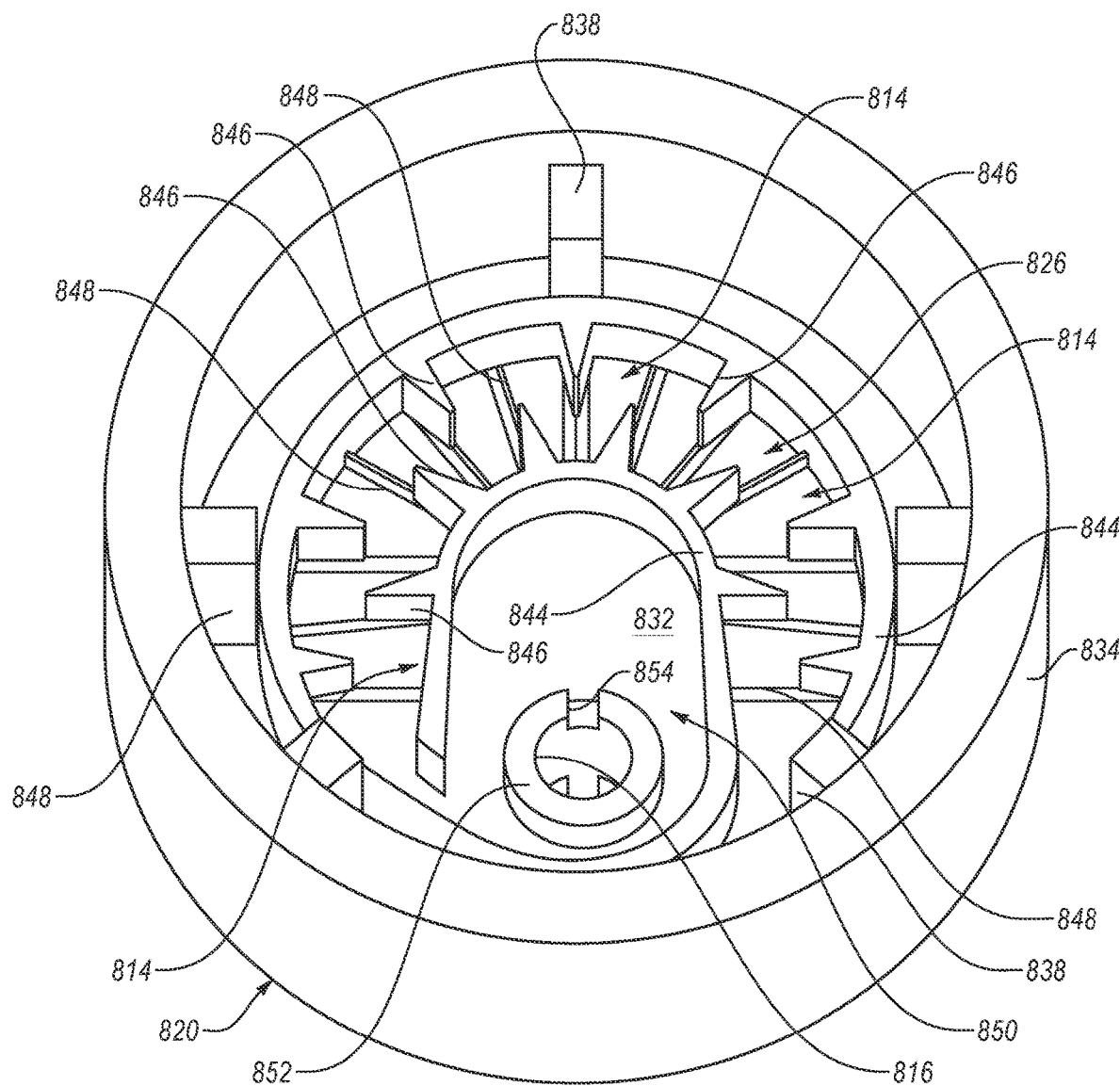
FIG. 8C illustrates a perspective view of a housing base of the pressure-compensating emitter of FIG. 8A showing the tortuous flow channel formed from the fluidic pathway pattern.

FIGS. 8A-8C illustrate an example of a pressure-compensating emitter 805 in accordance with the incorporated examples referenced herein.

The pressure-compensating emitter 805 comprises a compact emitter casing 802 which can be formed from assembled plastic molded emitter casing components. The emitter casing 802 includes a cup-shaped bottom body 820 adapted for assembly with a top body 822 to form a substantially enclosed emitter casing cavity. The fluidic pathway 814 is defined by a fluidic pathway pattern 826 (FIG. 8C) formed in the bottom body 820, in cooperative relation with a resilient and flexible elastomeric planar body 828 (e.g., pressure-deformable member, pressure-activated valve, non-controlled valve, passive valve, etc.). Water (e.g., or pressurized processing fluid) or other aqueous solution is supplied to the fluidic pathway 814 via an inlet 830 formed by the top body 822, and the solution is discharged from the flow channel through the discharge outlet 816 formed in the bottom body 820. The geometry of the fluidic pathway pattern 826 cooperates with the deformably-resilient planar body 828 to define the three dimensional fluidic pathway 814 for improved pressure drop between the inlet 830 and the outlet 816.

The emitter casing bottom body 820 has an upwardly open, cup-shaped construction including a circular bottom or base 832 joined at the perimeter thereof to a cylindrical upstanding outer wall 834. The fluidic pathway pattern 826 is formed on the base 832 with a circular or spiral configuration arranged about the outlet 816 which may include a short downwardly projecting hollow stem 836. The downwardly projecting hollow stem 836 may be omitted, or replaced with an opening or tube to allow the drops to exit in a controlled manner. A plurality of support members 838 are also formed on the bottom body 820 to project upwardly from the base 832 at the perimeter and terminate with upper ends disposed above the fluidic pathway pattern 826, but below the upper edge of the outer wall.

The deformably-resilient planar body 828 comprises a resilient disk having a size and shape to fit into the emitter casing bottom body 820, with an outer margin of the deformably-resilient planar body 828 fitting within the support members 838. The emitter casing top body 822 is then assembled with the bottom body 820 by press-fit mounting of the disk-shaped top body 822 into the open end of the base, to seat the top body 822 against the upper ends of the support members 838. The top body 822 can be securely connected to the bottom body 820 in a sealed manner by use of a suitable adhesive, or by ultrasonic welding or the like. When assembled, the emitter casing bottom body 820 and top body 822 defined an inlet chamber 840 (FIG. 8A) within which the deformably-resilient planar body 828 is retained with at least some floating movement in a position aligned over the fluidic pathway pattern 826. The inlet 830 is formed in the top body 822 and is typically associated with an inlet stem 842 which may include a barbed construction for press-on puncture type attachment to the tube 812 (e.g., tube 320).

As shown best in FIG. 8C, the fluidic pathway pattern 826 is defined by a pair of relatively short upstanding and laterally spaced-apart side walls 844. To fit within the desired compact package, these side walls 844 extend with a substantially uniform lateral spacing through a generally curved geometry between an outer inlet or upstream end disposed at the perimeter of the base 832 between a pair of the support members 838, and a downstream end in flow communication with a generally centered outlet chamber 850 which leads in turn to the outlet 816. The base 832 extends between the laterally spaced opposed portions of the side walls 844 from the bottom or lower wall of the fluidic pathway 814. The resilient deformably-resilient planar body 828 is forced by the pressure of water within the supply tube 812 and communicated to the inlet chamber 840 to seat against the upper edges of the two side walls 844. Accordingly, during normal operation, the deformably-resilient planar body 828 engages the side walls 844 of the fluidic pathway pattern 826 and thus cooperates therewith to form the upper wall boundary of the fluidic pathway 814.

In accordance with the present invention, the fluidic pathway 814 includes surface structures formed as part of the fluidic pathway pattern 826 to define the three dimensional tortuous flow path. More particularly, a plurality of flow diverting arms or teeth 846 are formed to extend from both side walls 844 partially into the fluidic pathway 814, wherein these arms 846 are arranged in a staggered or alternating fashion. In the preferred form, each flow diverting arm 846 has a length to extend laterally approximately to a centerline of the flow channel, whereby the arms 846 obstruct direct flow-through passage of the solution. The arms 846 force the solution to flow in a direction-changing laterally back-and-forth manner, with resultant velocity reduction and turbulence to achieve a substantial pressure reduction.

In accordance with a primary aspect of the invention, the fluidic pathway pattern 826 additionally includes a plurality of flow diverting surfaces, herein upwardly projecting ridges 848 formed on the lower wall or floor 832 of the emitter casing bottom body 820, and which project into the fluidic pathway 814 to cause the water flowing through the channel to be deflected vertically, thereby imparting an up-and-down directional change to the flow. The ridges 848 are disposed at regular intervals along the channel length, to extend laterally across and to project into the flow path in an orientation generally perpendicular to the arms 846. The ridges 848 are preferably provided in a number corresponding generally with the number of the flow diverting arms 846, with the ridges 848 being shown aligned with the individual arms 846. The height of the ridges 848 preferably are sufficient to extend about one-third up to about one-half of the height of the fluidic pathway 814. The ridges 848 function to force the solution to flow in a direction-changing up-and-down manner, again with resultant velocity reduction and related turbulence to achieve a further and substantial pressure loss.

From the fluidic pathway 814, in the preferred form of the invention, the solution enters the centrally located outlet chamber 850 bounded by the deformably-resilient planar body 828 and the inner wall surface of sides 844 of the underlying fluidic pathway pattern 826. This outlet chamber 850 includes a raised circular ridge 852 projecting upwardly from the floor 832 of the emitter casing bottom body 820 to engage the deformably-resilient planar body 828. The ridge 852 has an upwardly open discharge regulating groove 854 formed therein, for discharge flow of the solution from the outlet chamber 850 to the outlet 816 of the emitter. Importantly, the effective cross sectional size of this discharge regulating groove 854 varies in accordance with the pressure of the solution in the inlet chamber 840 as the deformably-resilient planar body 828 is pressure-forced partially into the groove 854 as a result of the pressure of the processing solution acting on its upper surface. The emitter thus provides for pressure compensation by varying the effective size of the discharge groove 854 as a function of inlet pressure, to achieve a substantially constant discharge outlet flow over a range of typical water supply pressures. Moreover, due to the increased pressure drop created by the three dimensional flow fluidic pathway pattern 826, the discharge regulating groove 854 can be of relatively large size yet still provide the desired pressure regulation function to produce drips.

In use, drip pressure-compensating emitters 805 (e.g., 305) of the invention are typically attached at selected points along the length of the supply tube 812 (e.g., tube 320), and processing solution is supplied to and through the supply hose at an appropriate elevated supply pressure. Each emitter 805 taps a portion of the water from the supply tube. At the time the water is initially turned on, the deformably-resilient planar body 828 is normally slightly unseated from the underlying fluidic pathway pattern 826 to permit a short flush flow of water substantially directly to the outlet 816. However, when the processing solution is pressurized to flow, the pressure rises quickly in the inlet chamber 840 to seat the deformably-resilient planar body 828 against the fluidic pathway pattern 826 and to provide appropriate pressure compensation relative to the discharge groove 854. Thereafter, processing solution flow through the emitter between the inlet 830 and the outlet 816 is confined to the three dimensional direction-changing fluidic pathway 814, with substantial flow turbulence and pressure reduction to provide a trickle or drip discharge flow rate which can be less than that provided in prior emitters of comparable size. The deformably-resilient planar body can function as a pressure-sensitive valve that acts to partially restrict the flow. As such, the deformably-resilient planar body can act as a valve that is not controlled or otherwise opened or claimed, whether manually or under a valve controller. Instead, the fluid pressure causes the deformably-resilient planar body to reposition and/or deform to restrict the flow through and out of the pressure-compensating emitter 805.

In some embodiments, a drip irrigation emitter can include an emitter casing having an inlet adapted for connection to the pressurized processing solution supply conduit, an outlet, and flow path structure forming an elongated pressure reducing flow channel defined by vertically spaced upper and lower walls interconnected by laterally spaced sides extending between said inlet and said outlet. The flow path structure can include a plurality of flow diverting arms projecting partially into the flow channel from opposite sides thereof and arranged in an alternating sequence along the channel length to cause the solution flowing through the flow channel to undergo repeated back-and-forth lateral directional changes between said sides. The flow path structure further including a plurality of flow diverting ridges disposed along the channel length and projecting partially into the flow channel from at least one of said walls to cause processing solution flowing through the flow channel to undergo repeated up-and-down directional changes between said walls.

Accordingly, the drip pressure-compensating emitter includes a housing (e.g., emitter casing that includes first and second housing components assembled to form a hollow housing interior, in the form of a container with a cavity therein. The inlet can be formed in the first housing component and the outlet can be formed in the second housing component. The laterally spaced sides and the lower wall of the flow path structure can be formed in the second housing component within the housing interior and define a fluidic pathway pattern. The resilient valve member can be positioned so that is overlying and engaging the fluidic pathway pattern within the housing interior. Also, the valve member can define the upper wall of said flow channel. The second housing component can include an upwardly open discharge regulating groove through which processing solution flows from said flow path structure to said water outlet, said resilient valve member overlying and engaging said groove to form a pressure compensating means for regulating water flow from said fluidic pathway pattern to said emitter outlet.

The valve member can be a resilient diaphragm. For example, the membrane can be rubber or elastomeric or other material. When a relatively high fluid pressure exists in the supply tube, a pressure differential is established across the resilient planar member (e.g., diaphragm, resiliently flexible flat valve member) which deforms the diaphragm into the second high-pressure diaphragm configuration. Specifically, this pressure differential arises due to the flow of fluid through the fluid passageway portion. Because the fluid passageway is formed as a tortuous path or a labyrinth, fluid flowing through the flow path experiences a pressure drop. This then establishes a pressure differential across the resilient valve member (e.g., diaphragm) between the inlet (high pressure) and outlet (low pressure).

In the second high-pressure resilient planar member (e.g., diaphragm, resilient flat valve member) configuration, the deformed diaphragm covers the inner portion of the fluid passageway, eliminating bypass and forcing fluid to flow through the entire fluid passageway. In this manner, a uniform flow is achieved over a range of line pressures. At low pressures, fluid bypasses in the inner fluid passageway portion while at high pressures, fluid is forced to transit through inner fluid passageway portion where its pressure and flow rate are reduced. This forms the droplets as described herein.

Another advantage of the present invention is that a lower flow rate of the processing solution 152 can be used compared to the prior art configuration of FIG. 3 without compromising the plate quality. This is desirable because it reduces the amount of processing solution 152 that must be used and disposed of for each processing plate. For comparison purposes, a Dantex DigiWash DW4835 system was fitted with a trough-based liquid distribution system similar to that shown in FIG. 3 where the trough 200 had 43 dripping holes 205. The lowest flow rate where an even dripping rate along the length of the trough 200 could be achieved was 7.5 liters/minute. This corresponds to a dripping rate of 0.175 liters/minute through each of the holes 205. The processing system was re-fitted with the pressure-compensating-emitter-based system of FIG. 5 where a total of 33 pressure-compensating emitters 305 were used. In this case, it was found that the total flow rate could be reduced to 2.5 liters/minute while still maintaining uniform flow across the width of the printing plate 20. This corresponds to a dripping rate of 0.076 liter/minute through each of the pressure-compensating emitters 305 and represents a 66% reduction in the total amount of processing solution 152 that is required without compromising the plate quality. The prior art configurations are not capable of operating at high quality levels at these low flow rates (e.g., flow rates per hole of less than 0.1 liters/minute).

While the exemplary embodiments have been described relative to processing units 104 used to process a printing plate 20 using aqueous processing solutions 152 containing a dispersing agent, it will be obvious to one skilled in the art that the invention can also be used for other types of processing systems as well. For example, it can be used for processing system that utilizes a solvent-based processing solution. It can also be used for a rinsing system 106 which rinses the printing plate 20 with water as described above. In one such embodiment, it was found that an improved rinsing system 106 using a pressure-compensating-emitter-based water supply system could achieve good results with a flow rate of 4.0 liters/minute whereas the prior art system required 10.0 liters/minute.

The invention has been described in detail with particular reference to certain preferred embodiments thereof, but it will be understood that variations and modifications can be effected within the spirit and scope of the invention.

In some embodiments, a method for processing a flexographic printing plate having a relief image is provided. The method can include providing a relief image into a processing unit that processes the flexographic printing plate with a processing liquid. The processing unit can be configured with the processing path with the hollow tube and pressure-compensating emitters of an embodiment described herein. The method can include emitting the processing liquid as drips from the plurality of pressure-compensating emitters. The drippings from the emitters can be used for washing the relief image with the processing liquid from the processing liquid drips.

In some embodiments, the method can include applying the processing liquid as drips to one or more brushes which move relative to the surface of the flexographic printing plate. The one or more brushes can be positioned and configured to apply the processing liquid to the relief image.

In some embodiments, the pressure-compensating emitters can regulate fluid flow so that the flow rate of the processing liquid drips from each pressure-compensating emitter is equal to within 30% of one another. In some aspects, the flow rate of the processing liquid drips from each of the pressure-compensating emitters is less than 0.1 liters/minute. In some aspects, the processing liquid drip rate is about 0.076 liter/minute per 33 pressure-compensating emitters, or about 0.0023 liters/minute. The liquid drip rate can be about 0.0010 to about 0.0035 liters/minute, or from about 0.002 to about 0.003 liters per minute. The number of pressure-compensating members can be integer but can range from 10 to 50 emitters, 15 to 45 emitters, 20 to 40 emitters, or 25-35 emitters.

In some embodiments, the processing liquid is an aqueous processing solution including a dispersing agent. In some aspects, the processing liquid includes a solvent. In some aspects, the processing liquid is water. In some aspects, the pressurized processing liquid supply system pressurizes the processing liquid to about 30-60 psi (0.2 MPa to 0.41 MPa).

In some embodiments, the resilient planar member is a resilient valve member disposed within an interior of the casing in a position to overlie a flow path pattern. The resilient valve member is positioned and configured for cooperating with the flow path pattern to define an elongated pressure reducing flow path with an upstream end in flow communication with the hollow tube and a downstream end in flow communication with the outlet. In some aspects, the outlet includes an upwardly open discharge regulating groove through which processing fluid flows from the fluidic flow path to the outlet, the resilient planar member overlying and engaging the groove to form a pressure compensating means for regulating fluid flow from the fluidic flow path to the outlet.

One skilled in the art will appreciate that, for the processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

All references recited herein are incorporated herein by specific reference in their entirety.

Additionally, cross-reference is made to commonly assigned, co-pending U.S. Pat. No. 10,324,378, entitled: "Aqueous processing method for flexographic printing plates", by D. Swihart et al.; and to commonly assigned, co-pending U.S. No. 2018/0004090, entitled: "Aqueous processing system for flexographic printing plates", by D. Swihart et al., each of which is incorporated herein by reference.

The invention claimed is:

1. A processing system for processing a flexographic printing plate, comprising:
   a processing path configured for processing the flexographic printing plate;
   a hollow tube having a length extending across the processing path;
   a pressurized processing liquid supply system for supplying pressurized processing liquid into an interior of the hollow tube; and
   a plurality of pressure-compensating emitters coupled to the hollow tube and distributed along the length of the hollow tube, wherein each pressure-compensating emitter includes:
      a casing having a fluidic flow path that is fluidly coupled with the hollow tube and having an outlet; and
      a resilient planar member in the casing and positioned to form at least one resilient surface of the fluidic flow path, wherein each pressure-compensating emitter is configured to control flow rate of the pressurized processing liquid to produce processing liquid drips from the outlet.

2. The processing system of claim 1, wherein the resilient planar member is positioned to provide a variable outlet cross-sectional profile to the outlet in response to pressure inside the casing.

3. The processing system of claim 2, wherein the resilient planar member is an elastomer, rubber, or other resilient material that is configured and positioned for regulating flow of the pressurized processing liquid through the outlet to a predetermined and substantially constant flow rate over a range of water pressures at the inlet.

4. The processing system of claim 3, wherein the outlet includes an upwardly open discharge regulating groove through which processing fluid flows from the fluidic flow path to the outlet, the resilient planar member overlying and engaging the groove to form a pressure compensating means for regulating fluid flow from the fluidic flow path to the outlet.

5. The processing system of claim 1, wherein the fluidic flow path is a tortuous flow path configured to cause a pressure drop in the pressurized processing liquid.

6. The processing system of claim 5, wherein the tortuous flow path is formed by one or more flow direction changing members that form a change in direction in the tortuous flow path.

7. The processing system of claim 6, wherein the one or more flow direction changing members include a plurality of first members projecting partially into the fluidic flow path from at least one side thereof along a length of the tortuous flow path to cause liquid flowing through the fluidic flow path to undergo repeated first directional changes.

8. The processing system of claim 6, wherein the one or more flow direction changing members include a plurality of second members projecting partially into the fluidic flow path and projecting at an angle relative to the first members and arranged along a length of the tortuous flow path to cause liquid flowing through the fluidic flow path to undergo repeated second directional changes at an angle relative to the first directional changes.

9. The processing system of claim 1, wherein the resilient planar member is a resilient valve member disposed within an interior of the casing in a position to overlie a flow path pattern, the resilient valve member cooperating with the flow path pattern to define an elongated pressure reducing flow path with an upstream end in flow communication with the hollow tube and a downstream end in flow communication with the outlet.

10. The processing system of claim 1, further comprising one or more brushes extending across the processing path with the hollow tube, wherein the plurality of pressure-compensating emitters deliver the processing liquid as liquid drips onto the one or more brushes.

11. A method for processing a flexographic printing plate having a relief image, comprising:
   providing a relief image into a processing unit that processes the flexographic printing plate with a processing liquid, the processing unit including:
      a processing path configured for processing the flexographic printing plate;
      a hollow tube having a length extending across the processing path;
      a pressurized processing liquid supply system for supplying pressurized processing liquid into an interior of the hollow tube; and
      a plurality of pressure-compensating emitters coupled to the hollow tube and distributed along the length of the hollow tube, wherein each pressure-compensating emitter includes:
         a casing having a fluidic flow path that is fluidly coupled with the hollow tube and having an outlet; and
         a resilient planar member in an interior of the casing and positioned to form at least one resilient surface of the fluidic flow path, wherein each pressure-compensating emitter is configured to control flow rate of the pressurized processing liquid to produce processing liquid drips;

emitting the processing liquid as drips from the plurality of pressure-compensating emitters; and washing the relief image with the processing liquid from the processing liquid drips.

12. The method of claim 11, further comprising applying the processing liquid as drips to one or more brushes which move relative to the surface of the flexographic printing plate, wherein the one or more brushes apply the processing liquid to the relief image.

13. The method of claim 11, wherein the flow rate of the processing liquid drips from each pressure-compensating emitter is equal to within 30% of one another.

14. The method of claim 11, wherein the flow rate of the processing liquid drips from each of the pressure-compensating emitters is less than 0.1 liters/minute.

15. The method of claim 11, wherein the processing liquid is an aqueous processing solution including a dispersing agent.

16. The method of claim 11, wherein the processing liquid includes a solvent.

17. The method of claim 11, wherein the processing liquid is water.

18. The method of claim 11, wherein the pressurized processing liquid supply system pressurizes the processing liquid to about 30-60 psi.

19. The method of claim 11, wherein the resilient planar member is a resilient valve member disposed within an interior of the casing in a position to overlie a flow path pattern, the resilient valve member cooperating with the flow path pattern to define an elongated pressure reducing flow path with an upstream end in flow communication with the hollow tube and a downstream end in flow communication with the outlet.

20. The method of claim 11, wherein the outlet includes an upwardly open discharge regulating groove through which processing fluid flows from the fluidic flow path to the outlet, the resilient planar member overlying and engaging the groove to form a pressure compensating means for regulating fluid flow from the fluidic flow path to the outlet.

* * * * *